United States Patent
Fedynyshyn

(10) Patent No.: US 6,815,145 B2
(45) Date of Patent: Nov. 9, 2004

(54) RESIST MATERIALS FOR 157-NM LITHOGRAPHY

(75) Inventor: Theodore H. Fedynyshyn, Sudbury, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 10/271,807

(22) Filed: Oct. 16, 2002

(65) Prior Publication Data

US 2003/0157431 A1 Aug. 21, 2003

Related U.S. Application Data

(63) Continuation of application No. 09/513,792, filed on Feb. 25, 2000, now Pat. No. 6,468,712.

(51) Int. Cl.$^7$ ............................. G03C 1/73; G03F 7/039
(52) U.S. Cl. ................... 430/270.1; 430/326; 430/907; 430/910; 430/914
(58) Field of Search .............................. 430/270.1, 326, 430/907, 910, 914

(56) References Cited

U.S. PATENT DOCUMENTS 6,503,686 B1 * 1/2003 Fryd et al. ............... 430/270.1

* cited by examiner

Primary Examiner—Mark F. Huff
Assistant Examiner—Sin J. Lee
(74) Attorney, Agent, or Firm—Thomas J. Engellenner; Reza Mollaaghababa; Nutter McClennen & Fish LLP

(57) ABSTRACT

A radiation sensitive resin composition including a photo-acid generator and an aliphatic polymer having one or more electron withdrawing groups adjacent to or attached to a carbon atom bearing a protected hydroxyl group, wherein the protecting group is labile in the presence of in situ generated acid is described. The radiation sensitive resin composition can be used as a resist suitable for image transfer by plasma etching and enable one to obtain an etching image having high precision with high reproducibility with a high degree of resolution and selectivity.

20 Claims, No Drawings

RESIST MATERIALS FOR 157-NM LITHOGRAPHY

RELATED APPLICATIONS

This application is a continuation application of the U.S. patent application Ser. No. 09/513,792, filed on Feb. 25, 2000, now U.S. Pat. No. 6,468,712 and entitled "Resist Materials for 157-nm Lithography," and herein incorporated by reference.

The U.S. government has rights in this invention pursuant to a contract awarded by the Department of Defense, Contract No. F19628-95-0002

BACKGROUND OF THE INVENTION

This invention generally relates to photoresist materials useful in micro-lithography and, particularly, to improved materials and methods for pattern formation on semiconductor wafers.

Processes for patterning semiconductor wafers typically rely on lithographic transfer of a desired image from a thin-film of radiation-sensitive resist material. The process entails the formation of a sacrificial layer, the "resist", which is photo-lithographically patterned. Generally these resists are referred to as "photoresists".

The patterning of the resist involves several steps, including exposing the resist to a selected light source through a suitable mask to record a latent image of the mask and then developing and removing selected regions of the resist. For a "positive" resist, the exposed regions are transformed to make such regions selectively removable; while for a "negative" resist, the unexposed regions are more readily removable.

The pattern can be transferred into surface texture in the wafer by etching with a reactive gas using the remaining, patterned resist as a protective masking layer. Alternatively, when a wafer is "masked" by the resist pattern, it can be processed to form active electronic devices and circuits by deposition of conductive or semiconductive materials or by implantation of dopants.

Materials used in single layer photoresists for optical lithography should meet several objectives. Low optical density at the exposure wavelength and resistance to image transfer processes, such as plasma etching, are two important objectives to be met by such a photoresist material. Shorter wavelengths of radiation permit greater resolution. The most common wavelengths currently used in semiconductor lithography are 365 nm and 248 nm. The desire for narrower linewidths and greater resolution has sparked interest in photoresist materials that can be patterned by even shorter wavelengths of light.

The high absorbance of many organic functional groups at 157 nm makes it difficult to develop an organic polymer that is both base soluble and has low absorbance at 157 nm. Traditional photoresist polymers contain either phenols or carboxylic acids to solubilize the base polymer. Both organic groups, phenols and carboxylic acids, impart an excess of absorbance to the polymeric resist material to allow the polymer to be an effective component of a single layer photoresist for 157 lithography.

For example, many polymeric photoresists generally incorporate aromatic groups within or are appended to the polymer backbone currently used in UV lithography. Aromatic groups within these polymeric photoresists absorb energy at about 250 nm and absorb so much energy at sub 200 nm ranges that they are ill-suited for use at 157 nm. Generally, the currently used UV photoresists include phenolic groups to facilitate dissolution in basic aqueous developing solutions, and it is the phenolic groups which absorb energy at shorter wavelengths. One approach to improve dissolution of the photoresists has been to incorporate carboxylic acid groups within the polymeric structure of the photoresist. However, carbonyl groups absorb energy in the 160 nm range, thereby posing a difficult problem towards preparing photoresistive materials which can be used at or below the 157 nm range.

SUMMARY OF THE INVENTION

Photoresist materials and methods of photolithography at very short ultraviolet wavelengths are disclosed employing photosensitive compositions which include a photo-acid generator and an aliphatic polymer that includes one or more protected hydroxyl groups. In addition, one or more electron withdrawing groups attached to or adjacent to a hydroxyl containing carbon of the polymer can be incorporated to improve the base solubility of the polymer after removal of the hydroxyl protecting group. In one embodiment, the present invention provides positive photosensitive compositions which do not absorb, or minimally absorb, radiant energy at wavelengths greater than 157 nm, thereby improving performance characteristics for lithography applications. The photosensitive compositions of the invention are particularly useful at 157 nm with fluoride excimer lasers that emit radiation and provide enhanced resolution and imaging over currently known photoresistive compositions.

In one aspect of the invention, the aliphatic polymer component of the photoresist includes one or more electron withdrawing groups adjacent to, or attached to, carbon atoms bearing protected hydroxyl groups, and the protecting groups are labile in the presence of in situ generated acid. Suitable electron withdrawing groups are those which do not interact with, or minimally absorb, visible or near ultraviolet radiation include carboxylate ion, fluorine, chlorine, bromine, iodine, N=NPh, carboxylic acid, carboxylic esters, e.g., t-butyl esters, ketone, trifluoromethyl, $NH_3^+$, CN, $SO_2Me$, nitro, $NMe_3^+$, and $N_2^+$, preferably, fluorine or chlorine groups. In one embodiment, the protected hydroxyl groups are covalently attached to carbon atoms bearing these electron withdrawing groups. In one embodiment, the protected hydroxyl groups are adjacent to carbon atoms bearing electron withdrawing groups. In another embodiment, the protected hydroxyl groups are both covalently attached to carbon atoms bearing electron withdrawing groups and are adjacent to carbon atoms bearing electron withdrawing groups. In another embodiment, halogen atoms attached to or adjacent to a hydroxyl containing carbon of the polymer improve base solubility of the polymer after in situ generated acid removal of the hydroxyl protecting groups. In a preferred embodiment, the halogen atoms are fluorine atoms.

The present invention also provides methods to prepare such photosensitive compositions, and methods to prepare circuits and/or devices with the compositions.

An interaction between an energy source, e.g. a source that generates 157 nm radiation, and the photo-acid generator results in the release of acid which facilitates selective cleavage of protecting groups from hydroxyl sites. As a consequence, the resultant unprotected hydroxyl groups are susceptible to solubilization under basic conditions, i.e., the regions of the photoresist material that are exposed to the far UV radiation are rendered alkali soluble, whereas the unexposed (protected hydroxyl) regions of the photoresist material remain alkali insoluble. Suitable protecting groups for the hydroxyl groups of the polymer include acetals, ketals, esters (including carbonates) and ethers.

In one general class of positive photosensitive compositions, according to the invention, polymer components can have the formula

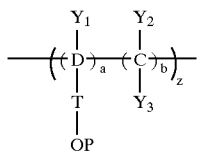

where D is a carbon atom or a cyclic or bicyclic group. $Y_1$, $Y_2$ and $Y_3$, are each independently hydrogen atoms, electron withdrawing groups (e.g., halogen atoms), or a pendent group as described below, and a is a positive value from 1 to 100, inclusive, b is a value from 0 to 100, inclusive, and z is a positive value from 2 to 100,000 inclusive. P is a protecting group for a hydroxyl group selected from the group of acetals, ketals, esters (including carbonates) and ethers and T denotes a covalent bond between carbon atom $D_a$ and OP, or is a bridging group having the formula:

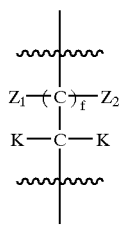

wherein $Z_1$ and $Z_2$ are each independently an electron withdrawing group or a hydrogen atom and f is a value from 0 to 6.

Each K, independently, is an electron withdrawing group, or a pendent group having the formula:

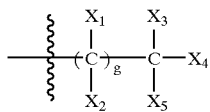

where $X_1$, $X_2$, $X_3$, $X_4$ and $X_5$ are each independently hydrogen atoms or electron withdrawing groups, preferably halogen atoms and g is a value from 0 to 4, inclusive.

For example, when D is a carbon atom and $Y_1$, $Y_2$ and $Y_3$ are hydrogen atoms then at least one, and preferably at least two, of $X_1$, $X_2$, $X_3$, $X_4$ or $X_5$ of T are electron withdrawing groups, e.g., halogen atoms, and when only one of $Y_1$, $Y_2$ and $Y_3$ are halogen atoms, then at least one of $X_1$, $X_2$, $X_3$, $X_4$ and $X_5$ of T preferably are electron withdrawing groups, e.g., halogen atoms. In some instances, when two or more of the $X_1$–$X_5$ constituents are electron withdrawing groups, it is preferably that both $X_1$ and $X_2$ or at least two of $X_3$, $X_4$ and $X_5$ be electron withdrawing groups, e.g., when g is 0.

In another general class of positive photosensitive compositions, according to the invention, polymer components can have the formula

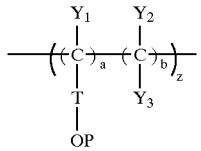

where $Y_1$, $Y_2$ and $Y_3$, are each independently hydrogen atoms, electron withdrawing groups, e.g., halogen atoms, or K, and a is a positive value from 1 to 100, inclusive, b is a value from 0 to 100, inclusive, and z is a positive value from 2 to 100,000 inclusive. P is a protecting group for a hydroxyl group selected from the group of acetals, ketals, esters (including carbonates) and ethers and T denotes a covalent bond between carbon atom $C_a$ and OP, or is a bridging group having the formula:

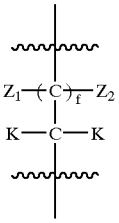

wherein $Z_1$ and $Z_1$ are each independently an electron withdrawing group or a hydrogen atom and f is a value from 0 to 6.

Each K, independently, is an electron withdrawing group, or a pendent group having the formula:

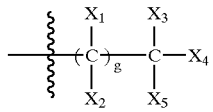

where $X_1$, $X_2$, $X_3$, $X_4$ and $X_5$ are each independently hydrogen atoms or electron withdrawing groups, preferably halogen atoms and g is a value from 0 to 4, inclusive. When $Y_1$, $Y_2$ and $Y_3$ are hydrogen atoms then at least one, and preferably at least two, of $X_1$, $X_2$, $X_3$, $X_4$ or $X_5$ of T are electron withdrawing groups, e.g., halogen atoms, and when only one of $Y_1$, $Y_2$ and $Y_3$ are halogen atoms, then at least one of $X_1$, $X_2$, $X_3$, $X_4$ and $X_5$ of T preferably are electron withdrawing groups, e.g., halogen atoms. In some instances, when two or more of the $X_1$–$X_5$ constituents are electron withdrawing groups, it is preferably that both $X_1$ and $X_2$ or at least two of $X_3$, $X_4$ and $X_5$ be electron withdrawing groups, e.g., when g is 0.

In another embodiment, the polymer has the formula

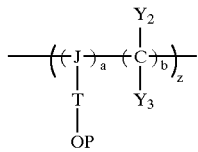

where J is a cyclic or bicyclic group and where $Y_2$ and $Y_3$, are each independently hydrogen atoms, electron withdrawing groups, e.g., halogen atoms, or K, and a is a positive value from 1 to 100, inclusive, b is a value from 0 to 100, inclusive, and z is a positive value from 2 to 100,000 inclusive. P is a protecting group for a hydroxyl group and T is a bridging group having the formula:

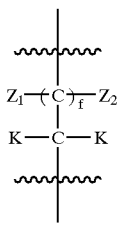

wherein $Z_1$ and $Z_2$ are each independently an electron withdrawing group or a hydrogen atom and f is a value from 0 to 6.

Each K, independently, is an electron withdrawing group, or a pendent group having the formula:

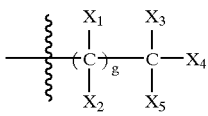

where $X_1$, $X_2$, $X_3$, $X_4$ and $X_5$ are each independently hydrogen atoms or electron withdrawing groups, preferably halogen atoms and g is a value from 0 to 4, inclusive.

Suitable cyclic and bicyclic groups for J include, but are not limited to, cyclohexyl groups, cyclopentyl, cycloheptyl, and norbornyl. Therefore, suitable monomers include those which include at least one degree of unsaturation within the cyclic or bicyclic structure such that polymerization can occur between reactive monomers.

It should be understood that not all hydroxyl groups need to be protected, that is, the hyroxyl groups within the polymer matrix can be partially protected. In general, it is considered advantageous to have at least 10% of the hydroxyl groups protected in a hydroxyl containing homopolymer. Preferably, between about 15% and about 50% of the hydroxyl groups are protected in the homopolymer.

Copolymers (including ter-, tetra-, etc. polymers) that contain unprotected hydroxyl groups are useful in the present invention. In one embodiment, at least 10% of the hydroxyl groups are protected. In another embodiment, at least 15% of the hydroxyl groups are protected. Again, preferably, between about 15% and about 50% of the hydroxyl groups are protected.

It should also be understood, and is well known by those skilled in the art, that most of the formulations suitable for use in this invention contain a small amount of base which may help to stabilize the polymer system. In general, less than 1% is a base component, based on the total weight of the polymer composition, e.g., less than 0.5%. Suitable bases typically are organic bases known in the art such as tetrabutylammonium hyroxide, diazabicyclo[5.4.0]undec-7-ene, diphenyl amine, trioctyl amine, or triheptal amine.

Suitable photo-acid generators include onium salts, such as triphenylsulfonium salts, sulfonium salts, iodonium salts, diazonium salts and ammonium salts, 2,6-nitrobenzylesters, 1,2,3-tri(methanesulfonyloxy)benzene, sulfosuccinimides and photosensitive organic halogen compounds as disclosed in Japanese Examined Patent Publication No. 23574/1979.

In addition to the hydroxyl protected polymer and photo-acid generator, small molecules which help to inhibit hydrolysis of the protected hydroxyl groups can be included in the compositions of the invention. These small molecules are typically ester, ether, ketal or acetal protected low molecular weight polyhydridic alcohols or low molecular weight alcohols. The protecting groups can further include those listed below. Suitable low molecular weight hydrolysis inhibitors include, for example, Di-Boc Bisphenol A, Di-Boc o-cresolphthalein, tert-butyl lithocholate and tert-butyl deoxycholate (available from Midori Kagaku Col, Ltd. Tokyo, Japan).

Thus the above described compositions include protected hydroxyl groups which are labile in the presence of in situ generated acid. Upon exposure to a far UV energy source, e.g. a source which generates 157 nm radiation, the photo-acid generator will release acid to facilitate selective cleavage of protecting groups from protected hydroxyl sites. As a consequence, the resultant unprotected hydroxyl groups will be susceptible to solubilization under basic conditions and the exposed photoresist material is rendered alkali soluble, whereas the unexposed photoresist material will remain alkali insoluble.

Other advantages of the invention will be readily apparent to one having ordinary skill in the art upon reading the following description.

All percentages by weight identified herein are based on the total weight of the polymer composition unless otherwise indicated.

DETAILED DESCRIPTION OF THE INVENTION

The features and other details of the invention will now be more particularly described and pointed out in the claims. It will be understood that the particular embodiments of the invention are shown by way of illustration and not as limitations of the invention. The principle features of this invention can be employed in various embodiments without departing from the scope of the invention.

Currently, very few if any single layer 157 nm sensitive resists are known. The known resist systems that are useful in the near ultraviolet region of the spectrum absorb too much energy at 157 nm and are not useful as single layer resists. High absorption at 157 nm limits the light penetration into the resist and does not allow for complete resist exposure at the bottom of the resist. Without complete resist exposure, the resist cannot image properly. If the resist is made thin enough to ensure full exposure, it may not be sufficiently thick to withstand subsequent processing steps such as plasma etching or ion implantation. To compensate for this problem, resist designers often resort to multilayer resists in which a sufficient thin resist is deposited on top of a second resist that is more photoreactive. While these composite resists are effective, resolution is compromised by the undercutting or widening of the exposed areas during development. The present invention provides materials and methods to produce single layer thin resists that are sufficiently thin so as to permit light to penetrate to the bottom of the resist while also being sufficiently thick enough to withstand etching and/or other post exposure processing steps. Conventional aqueous developers can be used to remove the exposed base soluble polymer after exposure to the radiant energy source.

The ability to form a photolithographic pattern is defined by Rayleigh's equation in which R represents a resolution or line width of an optical system. Rayleigh's equation is $$R = k\lambda/NA$$

wherein λ represents a wavelength of an exposure light, NA is a numerical aperture of a lens, and k is a process factor. It should be understood from the Rayleigh equation that a wavelength λ of an exposure light must decrease in value in order to accomplish a higher resolution or obtain a smaller R. For example, it is well known that a high pressure mercury vapor lamp emits a defined band of radiation (the "i-line") at a wavelength of 365 nm. Mercury vapor lamps have been used as a light source for manufacturing a dynamic random access memory (DRAM) having an integration equal to or smaller than 64M bits. Similarly, the KrF excimer laser emitting radiant energy at a wavelength of 248 nm is commonly used in a mass production of 256 bit DRAM devices. This manufacturing process requires a processing dimension smaller than 0.25 μm. Even shorter wavelengths are required for the manufacturing of DRAMs having an integration higher than 1 G bit s. Such devices will require a processing dimension smaller than 0.2 μm. For this purpose, other excimer lasers such as the KrCl laser having a wavelength of 222 nm, the ArF laser having a wavelength of 193 nm and, the $F_2$ laser having a wavelength of 157 nm, are currently being investigated.

The present invention is based, at least in part, on the discovery that photosensitive compositions for use at wavelengths below 248 nm can be formulated by combining a photo-acid generator and an aliphatic polymer than includes protected hydroxyl groups. The aliphatic polymer includes one or more electron withdrawing groups adjacent to or attached to carbon atoms bearing protected hydroxyl groups, wherein the protecting groups are labile in the presence of in situ generated acid. Suitable electron withdrawing groups are those which do not interfere with or absorb energy at or above 157 nm, e.g., fluorine, chlorine, or alkoxy groups. In one embodiment, the protected hydroxyl groups are covalently attached to carbon atoms bearing electron withdrawing groups. In another embodiment, the protected hydroxyl groups are adjacent to carbon atoms bearing electron withdrawing groups. In a preferred embodiment, the protected hydroxyl groups are both covalently attached to carbon atoms bearing electron withdrawing groups and are adjacent to carbon atoms bearing electron withdrawing groups.

In one embodiment, the aliphatic polymer has a molecular weight in the range of between about 500 and 5,000,000, inclusive, preferably between about 1000 and 1,000,000, inclusive, and most preferably between about 2,000 and about 200,000. Typically, the thickness of the polymer on the substrate is between about 10 and about 1000 nm, preferably between about 50 and about 500 nm. This thickness range of polymer is generally considered not able to withstand downstream processing, e.g., etching, plasma etching, of the substrate. However, the present invention provides thin polymeric films that can withstand downstream processing while allowing radiant energy to penetrate the entire thickness of the film.

The term "photo-acid generator" is recognized in the art and is intended to include those compounds which generate acid in response to radiant energy. Preferred photoacid generators for use in the present invention are those that are reactive to deep UV radiation, e.g., to radiant energy having a wavelength equal to or less than 248 nm, and are preferably highly reactive to radiation at 157 nm. The combination of the photo-acid generator and polymer should be soluble in an organic solvent. Preferably, the solution of the photo-acid generator and polymer in the organic solvent are suitable for spin coating. The photo-acid generator can include a plurality of photo-acid generators. The photo-acid generator is included in the composition at levels between about 0.01% and about 50%, more preferably between about 0.5% and about 20%, and most preferably between about 1.0% and about 10%, based on the total weight of the polymer composition.

Suitable photo-acid generators include onium salts, such as triphenylsulfonium salts, sulfonium salts, iodonium salts, diazonium salts and ammonium salts, 2,6-nitrobenzylesters, 1,2,3-tri(methanesulfonyloxy)benzene, sulfosuccinimides and photosensitive organic halogen compounds as disclosed in Japanese Examined Patent Publication No. 23574/1979. Examples of diphenyliodonium salts include diphenyliodonium triflate (DPI-105, Midori Kagaku Co. Ltd.) and diphenyliodonium tosylate (DPI-201, Midori Kagaku Co. Ltd.). Examples of suitable bis(4-tert-butylphenyl)iodonium salts include bis(4-tert-butylphenyl)iodonium triflate (BBI-105, Midori Kagaku Co. Ltd.), bis(4-tert-butylphenyl) iodonium camphorsulfate (BBI-106, Midori Kagaku Co. Ltd.), bis(4-tert-butylphenyl)iodonium perfluorbutylate (BBI-109, Midori Kagaku Co. Ltd.) and bis(4-tert-butylphenyl)iodonium tosylate (BBI-201, Midori Kagaku Co. Ltd.). Suitable examples of triphenylsulfonium salts include triphenylsulfonium hexafluorophosphite (TPS-102, Midori Kagaku Co. Ltd.), triphenylsulfonium triflate (TPS-105, Midori Kagaku Co. Ltd.) and triphenylsulfonium perfluorobutylate (TPS-109, Midori Kagaku Co. Ltd.).

Specific examples of the photosensitive organic halogen compound include halogen-substituted paraffinic hydrocarbons such as carbon tetrabromide, iodoform, 1,2,3,4-tetrabromobutane and 1,1,2,2-tetrabromoethane; halogen-substituted cycloparaffinic hydrocarbons such as hexabromocyclohexane, hexachlorocyclohexane and hexabromocyclododecane; halogen-containing s-triazines such as tris(trichloromethyl)-s-triazine, tris (tribromomethyl)-s-triazine, tris(dibromomethyl)-s-triazine and 2,4-bis(tribromomethyl)-6-methoxyphenyl-s-triazine; halogen-containing benzenes such as (bis(trichloromethyl) benzene and bis(tribromomethyl)benzene; halogen-containing sulfone compounds such as tribromomethylphenylsulfone, trichloromethylphenylsulfone and 2,3-dibromosulforane; and halogen-substituted isocyanurates such as tris(2,3-dibromopropyl)isocyanurate. Among such photosensitive organic halogen compounds, a bromine-containing compound is particularly preferred.

The term "protected hydroxyl group" is well recognized in the art and is intended to include those groups which are resistant to basic solutions but are removed under acidic conditions. The hydroxyl groups of the polymer can be protected by chemical reactions by using protecting groups which render the reactive hydroxyl groups substantially inert to the reaction conditions. (See for example, Protective Groups in Organic Synthesis, 2 ed., T. W. Green and P. G. Wuts, John Wiley & Sons, New York, N.Y. 1991). Thus, for example, protecting groups such as the following may be utilized to protect hydroxyl groups: acetals, ketals, esters, e.g., t-butyl esters, and ethers known in the art; trialkyl silyl groups, such as trimethylsilyl and t-butyldimethylsilyl (TBDMS); and groups such as trityl, tetrahydropyranyl, vinyloxycarbonyl, o-nitrophenylsulfenyl, diphenylphosphinyl, p-toluenesulfonyl, and benzyl, may all be utilized. Additionally, $CH_3OCH_2Cl$, $(CH_3)_3SiCH_2CH_2OCH_2Cl$, $CH_3OCH_2CH_2OCH_2Cl$, $ClCO_2$-t-butyl, methyl dihydropyran, methyl dihydrofuran, tetrabutylvinylether, 2-methoxypropene, isobutylvinylether and ethylvinylether are useful as protecting groups. (See for example, C. Mertesdor et al. Microelectronics Technology, 1995, pg. 35–55.)

The protecting group may be removed, after completion of the synthetic reaction of interest, by procedures known to those skilled in the art. For example, acetal and ketal groups may be removed by acidolysis, the trityl group by hydrogenolysis, TBDMS by treatment with fluoride ions, and TCEC by treatment with zinc. One skilled in the art will appreciate that the choice of a hydroxyl protecting group(s) is tailored to the specific application and conditions to which the protected hydroxyl group must withstand. Ultimately, the generation of acid from the photo-acid will cleave the oxygen bond to the protecting group to regenerate a free hydroxyl group.

It should be understood that the homopolymers and copolymers useful in the polymer compositions of the invention do not require that all hydroxyl groups be protected. Partial protection of the hydroxyl groups of the polymer is acceptable. The percentage of protection can vary and in general should be at least 10% of all hydroxyl groups. Preferably, between about 15% and about 50% of the hydroxyl groups are protected in a homopolymer.

The hydroxyl groups of the present invention are considered "acidic"; that is the pKa of the hydroxyl group is less than that of a typical hydroxyl group attached to a carbon atom bearing only hydrogen atoms. The acidity is due to a large degree to the proximity of electron withdrawing groups in relation to the hydroxyl group. Withdrawing groups attached to or adjacent to the hydroxyl containing carbon center render the hydroxyl group acidic in comparison to an equivalent structure with hydrogen atoms only. The acidic hydroxyl groups, therefore, are base soluble and can be solubilized from remaining polymer which contains hydroxyl protected groups. In general, the pKa of the hydroxyl decreases, e.g., becomes more acidic, as the amount of electron withdrawing groups increases about the carbon atom bearing the hydroxyl group.

For example, acidity of the hydroxyl proton will increase as hydrogen atoms are replaced by halogen atoms on the carbon atom to which the hydroxyl oxygen is connected. Additionally, the acidity of the hydroxyl proton will also increase as hydrogen atoms are replaced by halogen atoms on the carbon atoms adjacent to the carbon atom to which the hydroxyl group is directly attached. In a preferred embodiment, the hydroxyl group (shown as a protected hydroxyl group) is attached to a carbon center which is surrounded by carbon atoms which have hydrogen atoms substituted by electron withdrawing groups, e.g., fluorine groups. For example, such groups would include, but not be limited to, —$CF_2$—$C(OH)(R)$—$CF_2$, $CF_3$—$C(OH)(R)$—$CF_2$—, —$C(CF_3)_2OP$, —$C(CF_2$—$R)_2)OP$ where R can be an alkyl group or a suitable electron withdrawing group, e.g., a halogenated alkyl group, —$CF_2OP$, —$CF_2CF_2OP$, or —$CR(CF_3)OP$. Generally, the hydroxyl group should be adjacent to a carbon atom bearing at least one electron withdrawing group, more preferably two and most preferably three electron withdrawing groups. In a more preferred embodiment, the hydroxyl group should be adjacent to two carbon atoms bearing between two to six electron withdrawing groups. It should be understood that other suitable electron withdrawing groups can be substituted for the fluorine groups in the preceding examples.

Preferred electron withdrawing groups include halogens such as bromine, chlorine, iodine, and preferably fluorine.

In one embodiment, the protected hydroxyl group of the polymer is covalently attached to an electron withdrawing carbon atom. In this instance, the protected hydroxyl group shares a carbon atom with one or more electron withdrawing groups as shown below:

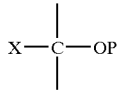

where X is an electron withdrawing group and P is the protective group as discussed above and two of the two remaining positions can include an additional electron withdrawing group or a carbon atom bearing hydrogen atoms or electron withdrawing groups while the other position(s) provides a linkage(s) to the polymer backbone. The polymer backbone includes repeating units which can include additional electron withdrawing groups and protected hydroxyl groups.

In another embodiment, the protected hydroxyl group of the polymer is adjacent to a carbon atom bearing one or more electron withdrawing groups. In this instance, the protected hydroxyl group can share a carbon atom with one or more electron withdrawing groups but is one carbon atom removed from the adjacent carbon atom which includes electron withdrawing groups as depicted below:

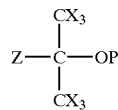

where Z can be the polymer backbone, repeating units, which can include additional carbon atoms having one or more electron withdrawing groups and/or additional protected hydroxyl groups. Additionally, Z can serve as a linking group to a polymer backbone. For example, Z can include linking groups such as $CX_2$, $CX_2CX_2$, $CH_2$, $CH_2CH_2$, CHX, CHXCHX, etc., where X is an electron withdrawing group, preferably, fluorine.

The present invention also provides positive photosensitive compositions, methods to prepare such compositions, and methods to prepare integrated circuits with the compositions, which include a positive photosensitive composition that includes a photo-acid generator and a polymer having protected hydroxyl groups as described above. In one embodiment, the polymer has the formula

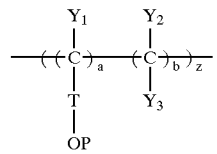

where $Y_1$, $Y_2$ and $Y_3$, are each independently hydrogen atoms, electron withdrawing groups, e.g., halogen atoms, or K, and a is a positive value from 1 to 100, inclusive, b is a value from 0 to 100, inclusive, and z is a positive value from 2 to 100,000 inclusive. P is a protecting group for a hydroxyl group and T forms a covalent bond between carbon atom $C_a$ and OP, or has the formula:

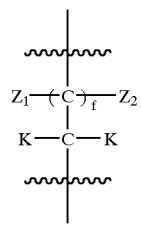

wherein $Z_1$ and $Z_2$ are each independently an electron withdrawing group or a hydrogen atom and f is a value from 0 to 6.

Each K, independently, is an electron withdrawing group, or a pendent group having the formula:

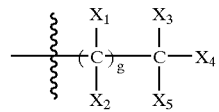

where $X_1$, $X_2$, $X_3$, $X_4$ and $X_5$ are each independently hydrogen atoms or electron withdrawing groups, preferably halogen atoms and g is a value from 0 to 4, inclusive.

When $Y_1$, $Y_2$ and $Y_3$ are hydrogen atoms then at least one, and preferably at least two, of $X_1$, $X_2$, $X_3$, $X_4$ or $X_5$ of T are electron withdrawing groups, e.g., halogen atoms, and when only one of $Y_1$, $Y_2$ and $Y_3$ are halogen atoms, then at least one of $X_1$, $X_2$, $X_3$, $X_4$ and $X_5$ of T preferably are electron withdrawing groups, e.g., halogen atoms. In some instances, when two or more of the $X_1$–$X_5$ constituents are electron withdrawing groups, it is preferably that both $X_1$ and $X_2$ or at least two of $X_3$, $X_4$ and $X_5$ be electron withdrawing groups, e.g., when g is 0.

In one embodiment, P acts as a tether between hydroxyl groups when a=2, such that the polymeric unit is a diol which can be protected as a ketal. It should be understood, that protection of the hydroxyl groups can be performed prior to or after polymerization and one skilled in the art can determine which procedure to undertake.

For example, when a=2 and $C_a$ carries a hydroxyl, ketals such as

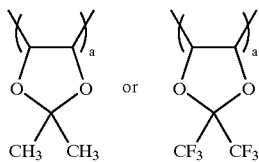

are preferred.

When a=1, b=1, followed by another a=1, where $C_a$ includes a hydroxy and $C_b$ is a methylene, for example, then ketals such as

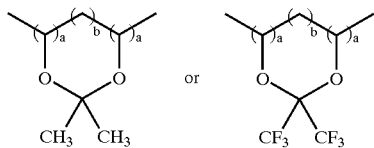

are preferred.

In another embodiment, the polymer has the formula

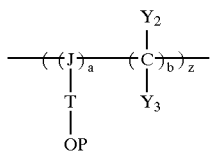

where J is a cyclic or bicyclic group and where $Y_2$ and $Y_3$, are each independently hydrogen atoms, electron withdrawing groups, e.g., halogen atoms, or K, and a is a positive value from 1 to 100, inclusive, b is a value from 0 to 100, inclusive, and z is a positive value from 2 to 100,000 inclusive. P is a protecting group for a hydroxyl group and T is a bridging group having the formula:

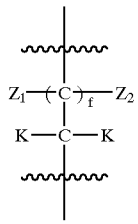

wherein $Z_1$ and $Z_2$ are each independently an electron withdrawing group or a hydrogen atom and f is a value from 0 to 6.

Each K, independently, is an electron withdrawing group, or a pendent group having the formula:

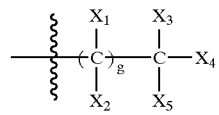

where $X_1$, $X_2$, $X_3$, $X_4$ and $X_5$ are each independently hydrogen atoms or electron withdrawing groups, preferably halogen atoms and g is a value from 0 to 4, inclusive.

Suitable cyclic and bicyclic groups for J include, but are not limited to, cyclohexyl groups, cyclopentyl, cycloheptyl, or norbornyl. Therefore, suitable monomers include those which include at least one degree of unsaturation within the cyclic or bicyclic structure such that polymerization can occur between reactive monomers.

In still two other embodiments, the present invention provides polymers having the formulae

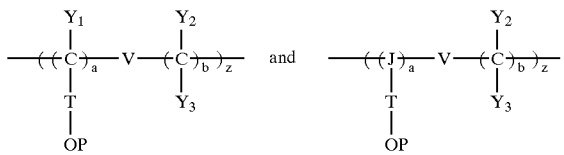

where a, b, z, $Y_1$, $Y_2$, $Y_3$, T, $C_a$, $C_b$, $J_a$ and OP are as defined above and wherein V is a heteroatom. Suitable heteroatoms include S, Se, Si, P and their stable oxidized states, e.g., $SO_2$. Suitable heteroatoms also include nitrogen, such that a secondary amines and tertiary amines are formed. Suitable alkyl groups attached to the nitrogen atom connected to the monomer units include lower alkyl groups, such as methyl, ethyl, propyl and butyl.

In addition to the hydroxyl protected polymer and photo-acid generator, small molecules which help to inhibit hydrolysis of the protected hydroxyl groups can be included in the compositions of the invention. These small molecules are typically ketal or acetal protected low molecular weight polyhydridic alcohols or low molecular weight alcohols. The protecting groups can further include those listed below. Suitable low molecular weight hydrolysis inhibitors include, for example, Di-Boc Bisphenol A, Di-Boc o-cresolphthalein, tert-butyl lithocholate and tert-butyl deoxycholate (available from Midori Kagaku Col, Ltd., Tokyo, Japan). Additionally, suitable inhibitors can include the compounds having the following structures:

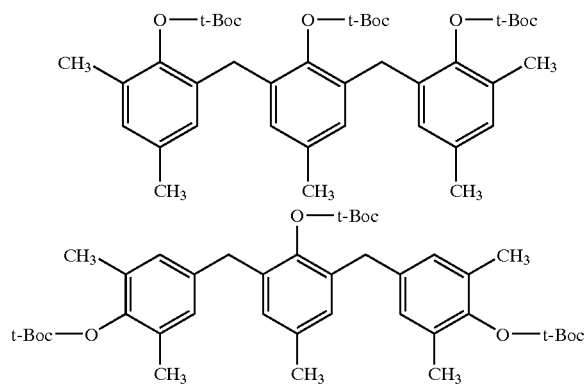

13

-continued

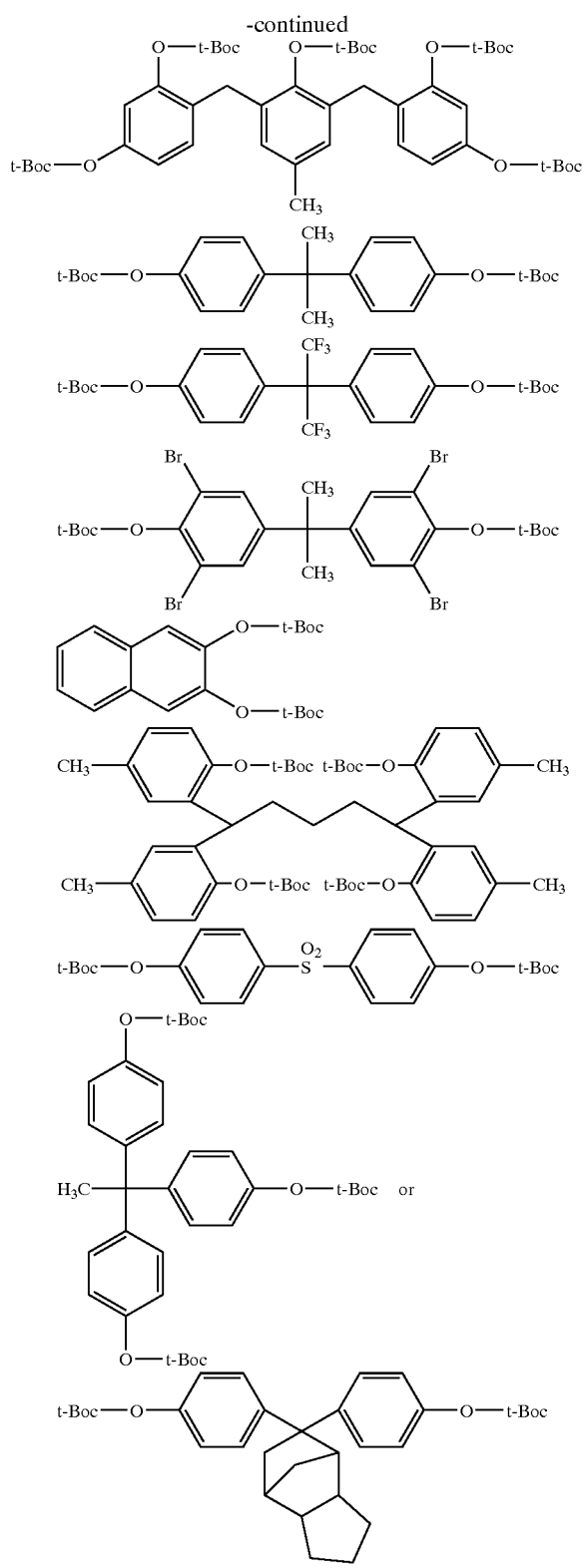

Accordingly, the present invention provides positive photosensitive compositions which are energy transparent to radiation which have a wavelength greater than or equal to 157 nm, thereby improving performance characteristics for lithography applications. Consequently, the positive photosensitive compositions of the invention are useful at 157 nm.

The present invention thus provides positive photosensitive compositions, methods to prepare such compositions, and methods to prepare integrated circuits with the compositions, which include a photo-acid generator and an aliphatic halogenated polymer. The polymers include protected hydroxyl groups which are labile in the presence of in situ generated acid.

An interaction between an energy source, e.g. a source which generates 157 nm radiation, with the photo-acid generates the release of acid which facilitates selective cleavage of protecting groups from hydroxyl sites. As a consequence, the resultant unprotected hydroxyl groups are susceptible to solubilization under basic conditions, e.g., the photoresist material is rendered alkali soluble, whereas the residual hydroxyl protected photoresist material remains alkali insoluble.

Polymeric compositions useful in the positive photosensitive compositions of the invention can be prepared by methods known in the art. For example, the following general synthetic schemes provide suitable preparations polymeric materials useful in the present invention. Several compositions are commercially available and are referred to as their tradenames and company of origin.

EXAMPLE 1

In one aspect, vinyl acetate is polymerized with 2-trifluoromethyl vinyl acetate, treated with a base followed by protection of the acidic hydroxyl groups as depicted in the following reaction sequence (m, n and q, used throughout the following reaction sequences represent that each monomeric unit can be randomly, repeating or copolymerized within a polymer backbone and that the polymeric chain can have a molecular weight between the values described throughout the application. The depictions should not serve to limit the ratios or alternating patterns of monomers and comonomers within the polymeric backbone as known to those of ordinary skill in the art.)

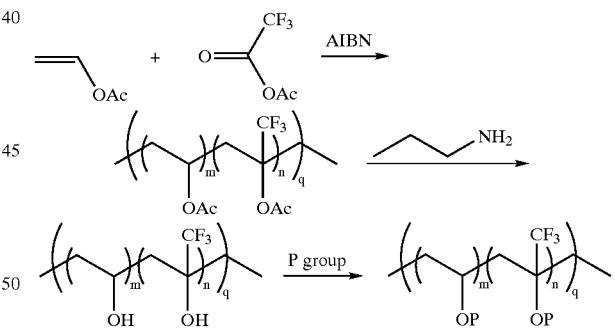

This reaction sequence is based on a polymer preparation developed by Haas. (H. C. Haas, and N. W. Schuler, *J. Polym. Sci.*, Part A, 2, p. 1641 (1964), and H. C. Haas, R. L. MacDonald and C. K. Chiklis, *J. Polym. Sci.*, Part A, 7, p. 633 (1969)

EXAMPLE 2

Polymerization of cyclopentadiene with hexafluoroacetone produces a polymer with tertiary hydroxyl groups. Hydrogenation of the sites of unsaturation followed by protection of the hydroxyl groups completes the synthesis as shown below.

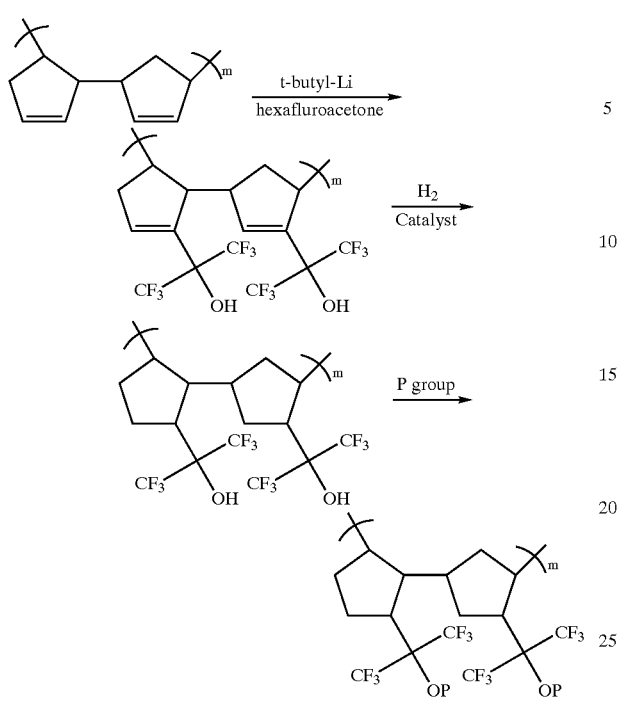
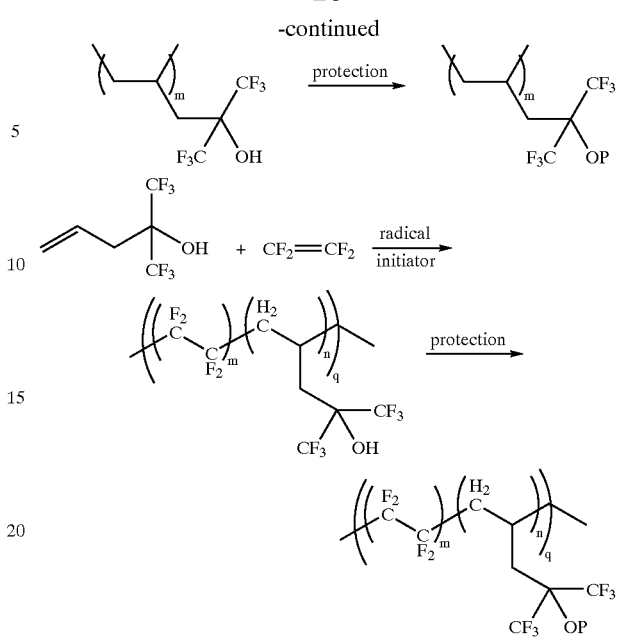

This reaction sequence is based on a polymer preparation developed by H. Kwart and M. W. Brechbiel, J. Org. Chem. 47, p. 3353, (1982).

EXAMPLE 3
The heteroatom containing polymer

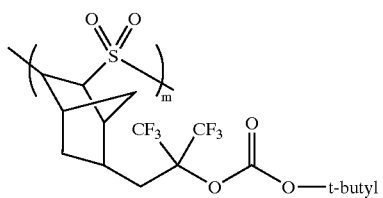

can be prepared by the method of H. Ito, N. Seekof, R. Sato, T. Nakayama and M. Ueda. *Micro- and Nanopatterning Polymers*, ACS Symposium Series 706, p. 208 (Ito et al., Eds. American Chemical Society, Washington, D.C. 1997).

EXAMPLE 4

Reaction of allyl magnesium bromide Grignard reagent with hexafluoroacetone provides a useful unsaturated tertiary alcohol. The unsaturated alcohol can be polymerized and then protected, or protected and then polymerized. The unsaturated alcohol is useful as an intermediate in the following synthetic preparations to prepare a homopolymer or as a copolymer with tetrafluoroethylene, cyclopentadiene, or an allylsiloxane.

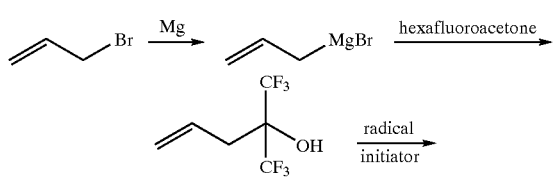

EXAMPLE 5

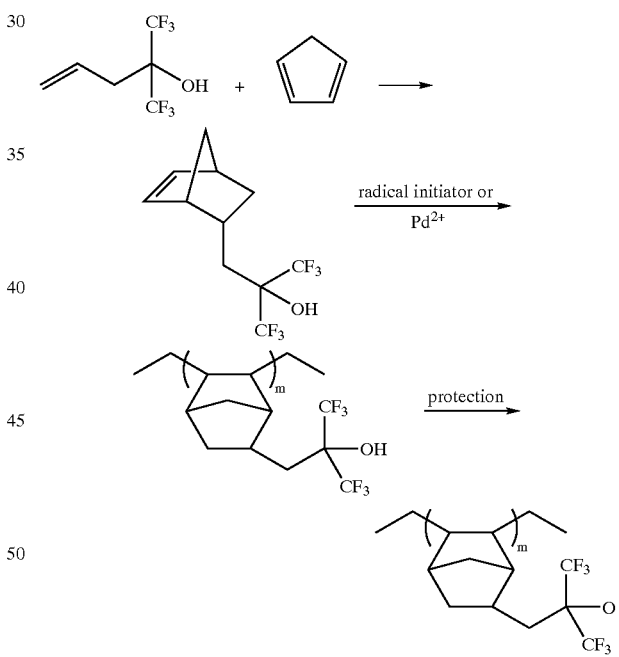

A. Sen, T. W. Lai and R. R. Thomas, *J. Organomet. Chem.,* 358, p. 567 (1988).

EXAMPLE 6

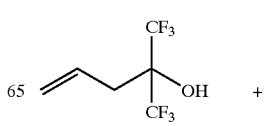

17

-continued

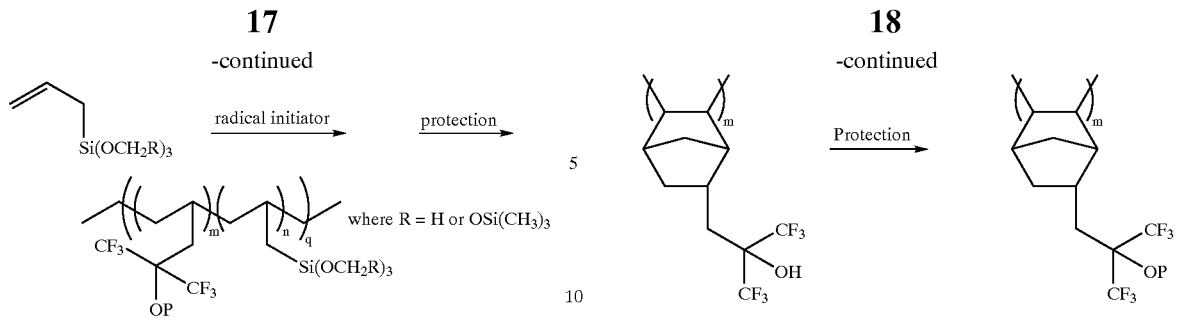

The preparation of the norbornyl intermediate above provides many opportunities to prepare polymers with a bicyclic backbone. The following synthetic schemes depict reactions between the norbornyl intermediate and tetrafluoroethylene, vinyl t-butyl carboxylate and maleic anhydride.

EXAMPLE 7

18

-continued

S. Breunig and W. Risse, *MakroMol. Chem.* 193, p. 2915 (1992).

EXAMPLE 9

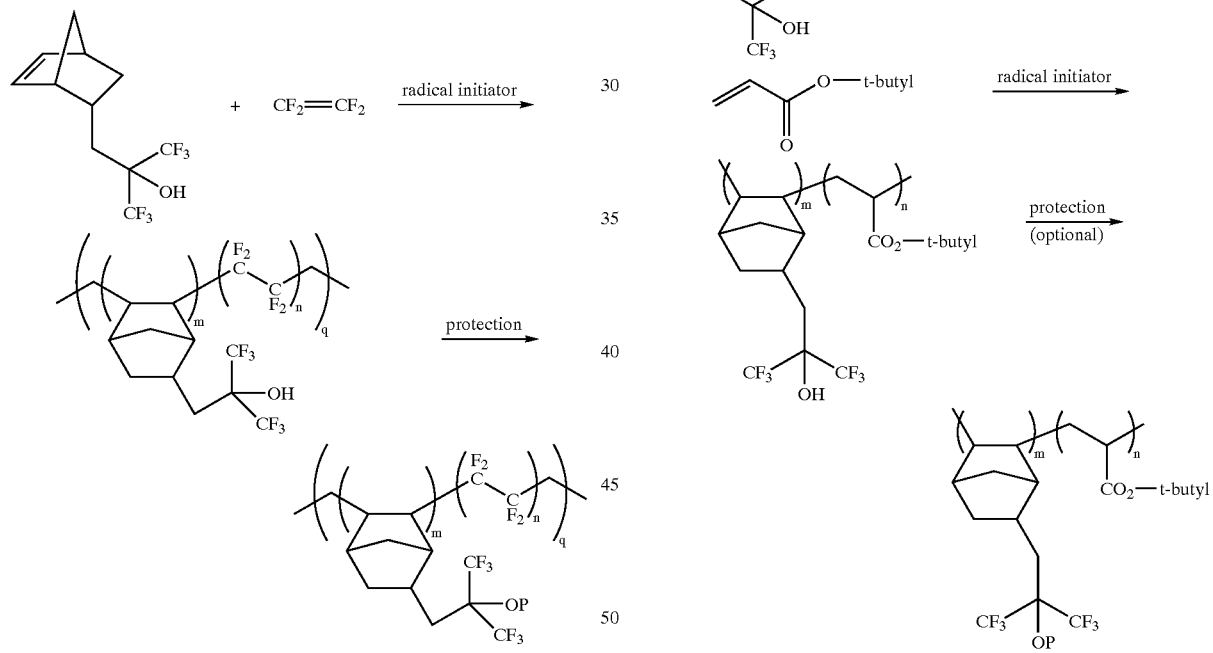

EXAMPLE 8

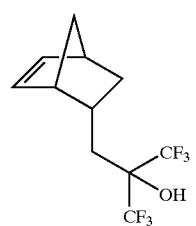

EXAMPLE 10

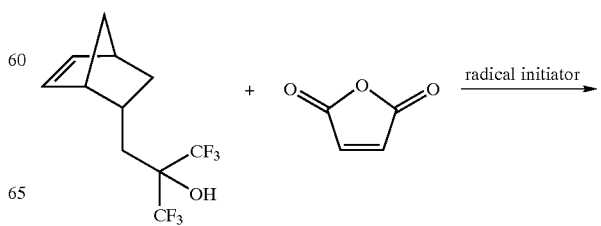

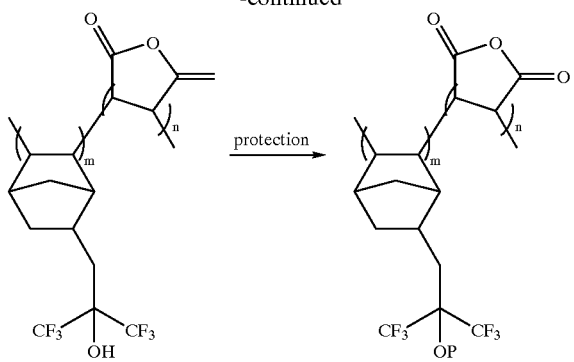

See, for example, F. M. Houlihan, A. Timko, R. Hutton, R. Cirella, J. M. Kometani, E. Reichmanis and O. Nalamusa, *Micro-and Nanopatterning Polymers*, ACS Symposium Series 706, p. 191 (Ito et al., Eds. American Chemical Society, Washington, D.C. 1997).

EXAMPLE 11

The reaction between 1-methyl propene with hexafluoroacetone provides a reactive fluorinated alcohol which can be further reacted with various monomers, as well as homopolymerized as depicted in the following reaction scheme.

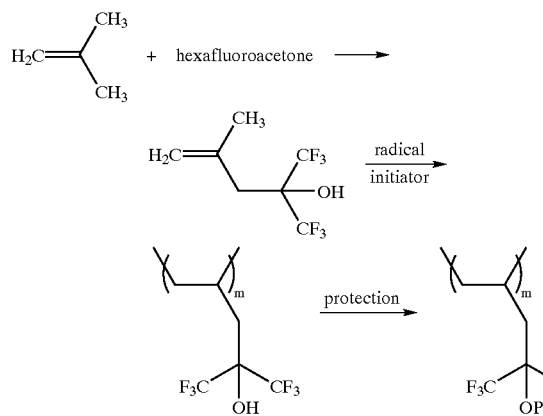

See for example, W. H. Urry, J. H. Y Niv. And L. G. Lundsted, J. Org. Chem. 1968, 33, 2302.

Additionally, commercially available polymers can include Teflon® AF 1600 and Teflon® AF 2400 (DuPont) and have the polymeric structure:

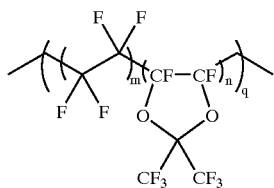

The photosensitive composition of the present invention can be used by dissolving the composition in a solvent. The solvent is not particularly limited, so long as it is a solvent capable of presenting adequate solubility to the resin, photoacid-generating material and capable of providing good coating properties. For example, it may be a cellosolve type solvent such as methyl cellosolve, ethyl cellosolve, methyl cellosolve acetate or ethyl cellosolve acetate. Ethylene glycol based solvents such as ethylene glycol monomethyl ether, diethylene glycol monomethyl ether, diethylene glycol dibutyl ether, diethylene glycol and diethylene glycol dimethyl ether are suitable as organic solvents for the photosensitive compositions of the invention. Propylene glycol based solvents such as propylene glycol monoethyl ether, propylene glycol monobutyl ether, propylene glycol monomethyl ether acetate, dipropylene glycol dimethyl ether or propylene glycol monoethyl ether acetate can be used. Suitable ester type solvents include butyl acetate, amyl acetate, ethyl butyrate, butyl butyrate, diethyl oxalate, ethyl pyruvate, ethyl-2-hydroxybutyrate, 2-methyl-acetoacetate, methyl lactate or ethyl lactate. Alternatively, alcohols are utilized and include heptanol, hexanol, nonanol, diacetone alcohol or furfuryl alcohol. Examples of suitable ketone solvents include cyclohexanone or methylamyl ketone. Ethers useful as solvating agents include methyl phenyl ether or diethylene glycol dimethyl ether. Polar solvents, such as dimethylformamide or N-methylpyrrolidone can also be used. The solvents can be used alone or as combinations of two or more solvents.

Typically the solvent is used in an amount of from 1 to 100 times by weight, e.g., 20 to 30 times by weight, relative to the total amount of the solid content of the photosensitive composition.

Further, the photosensitive composition of the present invention may contain various additives such as a surfactant, a coating property-improving agent, a stabilizer, a colorant and an ultraviolet absorber, to such an extent not to impair the desired properties.

Suitable surfactants which can be added to the photosensitive composition to improve coating ability include nonionic surfactants including polyoxyethylene alkyl ethers such as polyoxyethylene lauryl ether, polyoxyethylene stearyl ether and polyoxyethylene oleyl ether, polyoxyethylene alkylphenyl ethers such as polyoxyethylene octylphenyl ether and polyoxyethylene nonylphenyl ethers. Suitable nonionic ester surfactants include polyethylene glycol dialkyl esters such as polyethylene glycol dilaurate and polyethylene glycol distearate. Alternatively, fluorine-containing surfactants can be utilized which contain a fluoroalkyl or perfluoroalkyl group such as Efftop EF301, EF303 and EF352 (manufactured by Shinakitakasei Co., Ltd.), Megafac F171, F172 and F173 (manufactured by Dainippon Ink Co., Ltd.), Asahiguard AG710 (manufactured by Asahi Glass Co., Ltd.), Florade FC430 and FC431 (manufactured by Sumitomo 3M Co., Ltd.), and Surflone S-382, SC101, SC102, SC103, SC104, SC105 and SC106 (manufactured by Asahi Glass Co., Ltd.). Organosiloxane surfactants, such as organosiloxane polymer KP341 (manufactured by Shinetsu Kagaku Kogyo Co., Ltd.) are also suitable for decreasing the surface tension of the solution containing the photosensitive composition. Additionally, acrylic acid- or methacrylic acid-type polymers and copolymers such as Polyflow No. 75, No. 95 and WS (manufactured by Kyoeisha Yushikagaku Kogyo Co., Ltd.); and the like are also suitable surfactants. The amount of the surfactant to be added is usually less than 2 parts by weight, preferably 0.005–1 part by weight, per 100 parts by weight of the abovementioned condensate.

Furthermore, antioxidants or defoaming agents can be compounded as required to the radiation-sensitive composition of this invention.

After coating, the solvent will usually be removed by drying, conveniently in the temperature range from 70° to 160° C.

The resist film is a photopolymer composition which, after drying, has high photosensitivity, is not subject to autocatalytic decomposition, and has very good adhesion to the substrate. Furthermore, the resist film has high transparency and sensitivity, even in the wavelength range of 157 nm, and has good thermal stability.

To produce relief structures the substrate coated with the formulation of the present invention and is then exposed. The expression "exposure" will be understood as meaning not only exposure through a photomask that contains a predetermined pattern, for example a photographic transparency, but also exposure with a laser beam that is moved by computer control over the surface of the coated substrate to produce an image, irradiation with computer-controlled electron beams, as well as exposure with X-ray or UV radiation through an appropriate mask.

Exposure is normally carried out with UV radiation, preferably in the wavelength range from about 130 to 400 nm, more particularly from 150 to 200 nm and, most preferably, at 157 nm. Various known sources of radiation can be used for exposure, typically including mercury high-pressure lamps and UV lasers and, preferably, excimer lasers. The process parameters such as exposure time and distance from the radiation source and radiation-sensitive layer will usually depend on the type of radiation-sensitive formulation and on the desired properties of the coating, and can be determined by the person skilled in the art by routine experimentation.

After exposure, the wafer can be heated or baked at about 50° to about 160° C. for a few seconds to a few minutes. Subsequently the exposed areas of the photoresist are washed out with a developer. The choice of developer will depend on the type of photoresist, in particular on the nature of the binder employed or of the resultant photolysis products. The developer may comprise aqueous solutions of bases to which organic solvents or mixtures thereof may be added.

The novel formulations are preferably used as positive photoresists. A further object of the invention is therefore a process for the production of relief structures, which process comprises the following process steps in the indicated sequence:

Applying a layer consisting of a formulation as described above to a substrate;

Exposing of the coating with radiation; and

Treating the coating with a developer consisting of an aqueous alkaline solution until the areas subjected to radiation are removed.

Particularly preferred developers are the aqueous alkaline solutions that typically include solutions of alkali metal silicates, alkali metal phosphates, alkali metal hydroxides and alkali metal carbonates, but preferably tetraalkylammonium hydroxide solutions such as tetramethylammonium hydroxide solution. To these solutions may be added minor amounts of wetting agents and/or organic solvents. Typical organic solvents that may be added to the developer fluids include cyclohexanone, 2-ethoxyethanol, toluene, acetone, isopropanol, ethanol, as well as mixtures of two or more of these solvents.

The application of the developer is preferably effected by immersing the coated and imagewise exposed substrate in the developer solution, by spraying the developer solution on to the substrate, or by repeatedly applying and spin-coating the developer on to the coated and imagewise exposed substrate.

With the photosensitive compositions of the present invention, it is possible to obtain a pattern profile of high resolution by exposure with a light having a wavelength in the deep UV region. Accordingly, the compositions are extremely useful as photoresists, particularly for the production of very large scale integrated circuits.

Those skilled in the art will know, or be able to ascertain, using no more than routine experimentation, many equivalents to the specific embodiments of the invention described herein. These and all other equivalents are intended to be encompassed by the following claims. All publications and references cited herein, including those in the background section, are expressly incorporated herein by reference in their entirety.

What is claimed is:

1. A positive photoresist composition comprising a photo-acid generator and an aliphatic co-polymer comprising a plurality of hydroxyl groups, a least 10% of said hydroxyl groups being protected by a protecting group that is labile in presence of in-situ generated acid, wherein at least a portion of said hydroxyl groups are rendered more acidic by halogen atoms attached to or adjacent to carbon atoms bearing said hydroxyl groups.

2. The positive photosensitive composition of claim 1, wherein said protected hydroxyl groups belongs to an ester group.

3. The positive photosensitive composition of claim 2, wherein said protected hydroxyl groups comprises t-butyl moieties.

4. The positive photosensitive composition of claim 1, wherein said co-polymer comprises hexafluoroisopropanol-methylnorbornene as one monomeric unit and t-butyl acrylate as another monomeric unit.

5. The positive photosensitive composition of claim 1, wherein said aliphatic polymer is a fluorinated polymer.

6. The positive photosensitive composition of claim 1, wherein said photoacid generator is an onium salt.

7. The positive photosensitive composition of claim 1, wherein said aliphatic polymer is an alkali insoluble polymer.

8. The positive photosensitive composition of claim 1, wherein said halogen atoms are fluorine atoms.

9. The positive photosensitive composition of claim 1, wherein each of said carbon atoms bearing the more acidic hydroxyl groups is covalently attached to two halogen bearing carbon atoms.

10. The positive photosensitive composition of claim 9, wherein the halogens of said two halogen bearing carbon atoms are fluorine atoms.

11. A positive photosensitive composition comprising a photoacid generator and a co-polymer having an aliphatic backbone, said co-polymer having a first monomeric unit and a second monomeric unit, said monomeric units having pendant chains bearing hydroxyl groups, at least about 10% of said hydroxyl groups being protected by an acid-labile protecting group, and at least a portion of said hydroxyl groups being rendered more acid by halogen atoms attached to or adjacent to carbon atoms bearing said hydroxyl groups.

12. The positive photosensitive composition of claim 11, wherein said protected hydroxyl groups belongs to an ester group.

13. The positive photosensitive composition of claim 12, wherein said protected hydroxyl groups comprises t-butyl moieties.

14. The positive photosensitive composition of claim 11, wherein said photo-acid generator is an onium salt.

15. The positive photosensitive composition of claim 11, wherein said aliphatic polymer is alkali insoluble.

16. The positive photosensitive composition of claim 11, wherein said first monomer is hexafluoroisopropanolmethylnorbornene and said second monomeric unit is t-butyl acrylate.

17. The positive photosensitive composition of claim 11, wherein said halogen atoms are fluorine atoms.

18. The positive photosensitive composition of claim 11, wherein each of said carbon atoms bearing the more acidic hydroxyl groups is covalently attached to two halogen bearing carbon atoms.

19. The positive photosensitive composition of claim 18, wherein the halogens of said two halogen bearing carbon atoms are fluorine atoms.

20. The positive photosensitive composition of claim 19, wherein each of said two halogen bearing carbon atoms is attached to at least two fluorine atoms.

* * * * *